United States Patent
Uzoh et al.

(10) Patent No.: US 6,815,354 B2
(45) Date of Patent: Nov. 9, 2004

(54) METHOD AND STRUCTURE FOR THRU-MASK CONTACT ELECTRODEPOSITION

(75) Inventors: Cyprian Uzoh, San Jose, CA (US); Bulent M. Basol, Manhattan Beach, CA (US); Homayoun Talieh, San Jose, CA (US)

(73) Assignee: NuTool, Inc., Milpitas, CA (US)

( * ) Notice: Subject to any disclaimer, the term of this patent is extended or adjusted under 35 U.S.C. 154(b) by 0 days.

(21) Appl. No.: 10/282,976

(22) Filed: Oct. 28, 2002

(65) Prior Publication Data

US 2003/0080431 A1 May 1, 2003

Related U.S. Application Data (60) Provisional application No. 60/343,573, filed on Oct. 27, 2001.

(51) Int. Cl.[7] .............................................. H01L 21/00
(52) U.S. Cl. ........................ 438/692; 438/669; 438/672
(58) Field of Search ................................. 438/692, 669, 438/672, 748; 216/38, 48, 88, 92; 204/206; 205/135; 257/432

(56) References Cited

U.S. PATENT DOCUMENTS

| | | | | |
|---|---|---|---|---|
| 4,431,500 A | * | 2/1984 | Messing et al. | 204/206 |
| 6,027,630 A | * | 2/2000 | Cohen | 205/135 |
| 6,117,784 A | | 9/2000 | Uzoh | |
| 6,410,442 B1 | * | 6/2002 | Yang | 438/692 |
| 6,475,369 B1 | * | 11/2002 | Cohen | 205/135 |
| 6,572,742 B1 | * | 6/2003 | Cohen | 204/297.05 |
| 6,653,705 B2 | * | 11/2003 | Ushijima et al. | 257/432 |

* cited by examiner

*Primary Examiner*—Carl Whitehead, Jr.
*Assistant Examiner*—Laura M Schillinger
(74) *Attorney, Agent, or Firm*—NuTool Legal Department (57) ABSTRACT

A process for forming a conductive structure on a substrate is provided. The substrate has a copper seed layer that is partially exposed through a plurality of openings in a masking layer such as a photoresist. The masking layer is formed on the seed layer. The process electroplates copper through the openings and onto the seed layer. During the copper electroplating process the surface of the masking layer is mechanically swept. The process forms planar conductive material deposits filling the plurality of holes in the masking layer. The upper ends of the conductive deposits are substantially co-planar.

19 Claims, 6 Drawing Sheets

METHOD AND STRUCTURE FOR THRU-MASK CONTACT ELECTRODEPOSITION

REFERENCE TO RELATED APPLICATIONS

This application claims priority to U.S. Provisional Application No. 60/343,573 filed Oct. 27, 2001 entitled Method and Structure for Thru-Mask Contact Electrodeposition, incorporated herein by reference.

FIELD

The present invention generally relates to semiconductor integrated circuit technology and, more particularly, to a process for electroplating on a workpiece.

BACKGROUND

In IC fabrication, formation of wiring networks on the ICs often presents technological problems. In particular, certain applications require formation of both narrow wires or other structures and wide wires, electrodes, bond pads or other structures, with the narrow and wide structures adjacent to one another and as closely spaced as allowed. Such conductive networks require forming narrow and large gaps through a mask layer, which is typically a photoresist layer, coated on a substrate and filling them with a conductive material such as copper.

Figure 1:
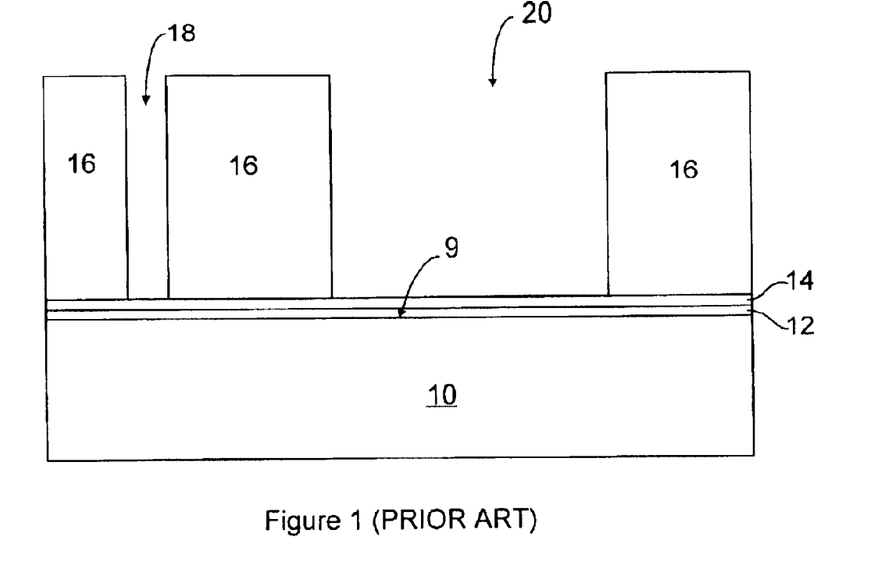
Figure 2A:
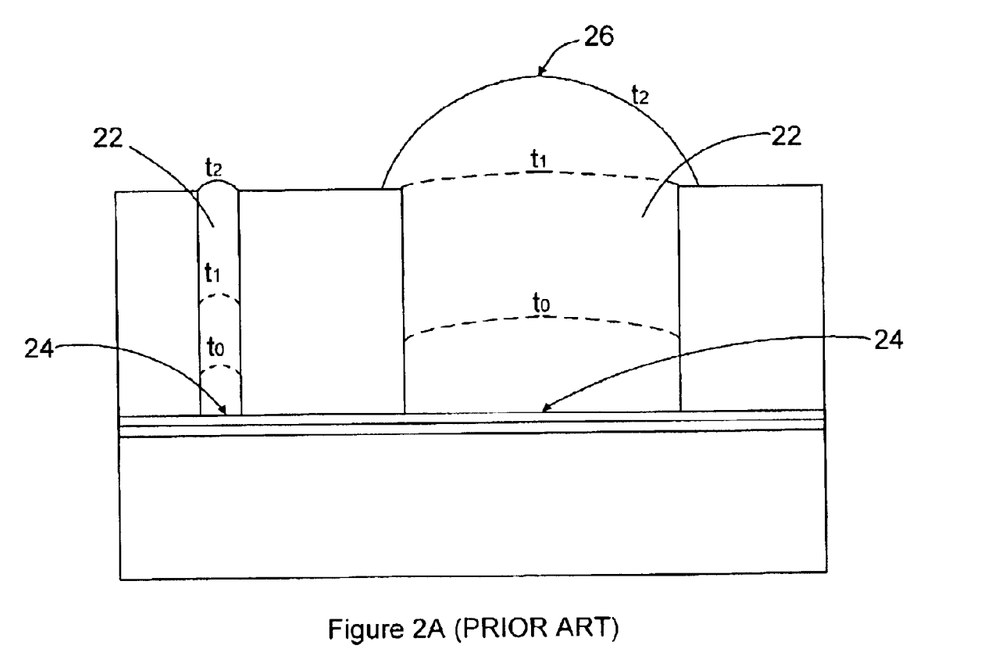

As exemplified in FIG. 1, in one conventional process, an upper surface 9 of a silicon or device substrate 10 is first coated with a barrier layer 12 and then with a copper seed layer 14. It should be noted that the substrate 10 typically contains more layers of metal interconnect structures, insulators and devices below the upper surface 9, which are not shown in detail in FIG. 1. The barrier layer 12 helps adhesion of copper to the upper surface 9 and also serves as a diffusion barrier for copper. The barrier layer 12 is typically made of a single or multilayer films, such as Ta, TaN, Cr, TiW, NiP, TaN/Ta, WC, WN, WNC, Al/Ni—V, carbon and nitrogen doped tungsten or even, Ti/Cu/Ni layer and their various combinations. In Ti/Cu/Ni, Ti is for adhesion and sealing, Cu for current conduction and Ni serves as the diffusion barrier and wettable layer. In some other applications a dewetting layer or surface or region may also be incorporated. The seed layer 14 may be a thin film copper, or copper alloy, silver or silver alloy layer that provides a base layer on which better nucleation and growth of the subsequently deposited metal layer can take place. A resist layer 16 is formed on the seed layer 14 and defined and etched to form various features by lithographic processes. The resist material may be soft or hard baked organic materials, it could be inorganic materials such as silicon oxide, alumina or even sapphire. The resist material may also be a low or high dielectric constant material. In this invention, a resist material is a material that copper or any metal of interest will not substantially nucleate on without a seed layer coating. In FIGS. 1 and 2A two exemplary features etched in the resist, a narrow line or via 18 and a wider structure such as a trench or a via 20 are shown with the seed layer in exposed portions 24 on the bottom of these features. These features require filling with copper.

Filling up such features with copper with the conventional electroplating processes from additive or additive free baths, present problems. As shown in FIG. 2A, as copper layer 22 grows on exposed portions 24 of the seed layer to fill the features from bottom to top, wider features or trenches 20 may fill up before narrower features or lines 18. As seen in FIG. 2A, at time $t_1$, although the wide trench 20 is already filled, the narrow line 18 is only partially filled. As the electroplating time is extended until time $t_2$ in order to fill the narrow line 18, the wide trench 20 is overfilled and a copper dome 26 may form on the wide trench 20 due to the extra electroplating time.

Such filling discrepancies between features of various shapes and sizes may be due to various reasons such as differences in mass transfer of the plating electrolyte into features with different aspect ratios, the location of the features with respect to high current density regions such as contacts, and location of different size features with respect to each other. For example, apart from concerns about nonuniform electric field distribution across the workpiece, mass transfer is not as efficient in small features as in large features. Therefore, current densities tend to be higher in larger features. If a small and large feature are side by side and their size difference is high, the large feature may steal current density from the small one resulting in the phenomenon depicted in FIG. 2A.

Further, in IC design, if the larger feature density is higher on certain regions of the IC, the severity of this problem becomes higher in such regions. As is apparent, taking into account such factors limit the most efficient circuit layout in terms of electrical circuit performance. This is particularly true since rigid design rules also need to be followed. For instance, all vias may be essentially the same diameter according to the specified design rules, and their minimum spacing from each other may also be specified by the design rules, such as being at least ¼ of their diameter to prevent shorting and the like. Such design rules, while necessary using conventional process technologies, nonetheless result in a loss of flexibility in wiring design and layout, thereby causing losses in wiring densities, but also resulting in performance penalties and the inability to integrate certain functionalities in a package or wafer. For example, it may result in passive and active electrical elements, or the leads thereto, not being capable of being integrated in close proximity to each other. One aspect of this reduced flexibility is that many wide features cannot be fabricated in very close to very narrow lines, as mentioned above. Many very fine lines or features, for example those less than 5 microns in width, cannot be readily attached to very wide lines, vias or features larger than, for example, 20 microns, without incurring severe cost penalties.

If the various features, regardless of dimensions, shape, locations or relative locations on a workpiece could be filled up in a uniform manner at the same rate, many of the problems discussed above would be overcome.

As discussed above, conventional copper deposition methods yield a copper structure that is very non-uniform, i.e., some features are overfilled at the expense of others. The overfilled extra copper needs to be subsequently removed using material removal techniques such as chemical mechanical polishing (CMP) process. These material removal techniques are complicated and costly, and even more costly, especially when a thick layer of the conductive material is to be planarized.

Figure 2B:
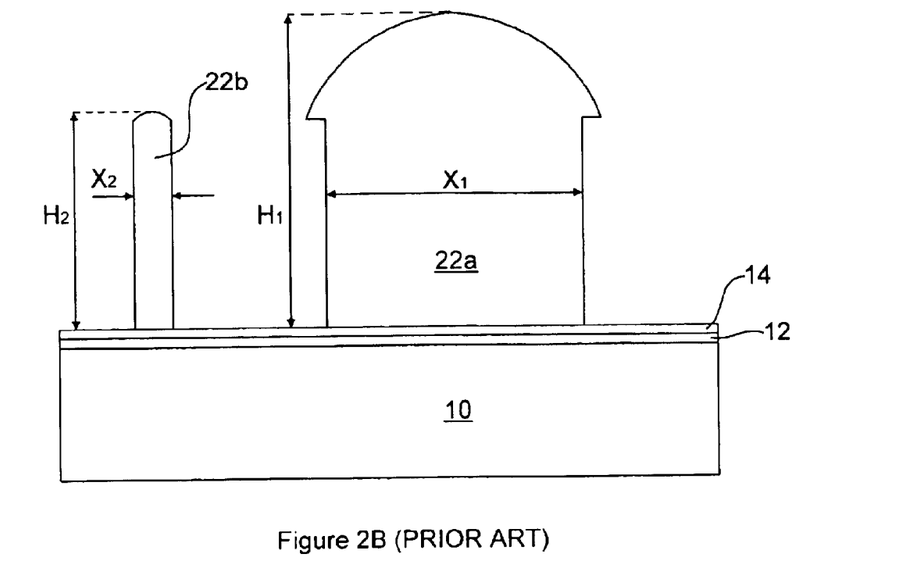
Figure 2C:
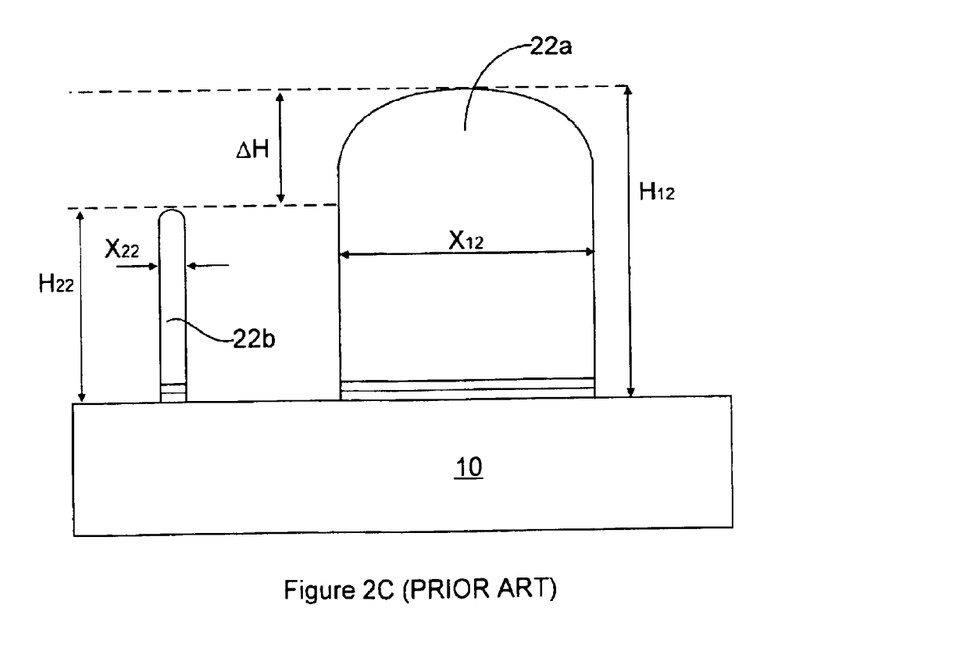

Conventionally, after the metal deposition, the resist layer 16, and the seed layer 14 and barrier layer portions disposed below the resist layer are removed to isolate the various electrical structures of interest, as shown in FIG. 2B. The large disparity in the height of large structure and smaller one is obvious in the absence of the masking resist layer. The height $H_1$ of the copper structure 22a is significantly greater than $H_2$ of the copper structure 22b. After seed layer and barrier layer removal, the difference between the small and the large features becomes even more significant. The seed layer thickness is nearly insignificant when compared to the width $X_1$ and height $H_1$ of structure 22a. Because the removal process can affect all of the conductors, it can affect all structures, not only the seed layer and barrier layer portions being removed. Thus removal of the seed layer portions does not significantly affect the structure 22a, in terms of the desired width $X_{12}$ and height $H_{12}$ in FIG. 2C, which shows the structures after the removal of the seed and barrier layer portions. The seed layer portion removal, however, may be catastrophic for finer features such as the structure 22b as shown by the significantly reduced size of the structure 22b that has been affected by the removal process. Mass transfers and surface area effects cooperate during seed layer removal to produce an undesirable structure, especially with respect to the height $H_{22}$ of the structure 22b. The large difference '$\Delta H$' between the heights of two structures of differing sizes also represents a severe design rule violation. This is another fundamental reason that limits the choice of pattern geometries and their layouts in many device designs employing thru-mask plating processes.

To this end, there is a need for development of a thru-mask plating technology that eliminates the strict limits imposed by the conventional plating methods.

SUMMARY

The present inventions provide methods and apparatus to enable thru-mask contact electrodeposition without the disadvantages suffered by conventional thru-mask deposition methods.

In one aspect of the present invention, a process for forming a conductive structure on a substrate is provided. The substrate has a metal seed layer that is partially exposed through a plurality of openings in a masking layer such as a photoresist. The masking layer is formed on the seed layer. The process electroplates copper through the openings and onto the seed layer. During the copper electroplating process the surface of the masking layer is mechanically swept. The process forms planar conductive material deposits filling the plurality of holes in the masking layer. The upper ends of the conductive deposits are substantially co-planar In particular, the present inventions minimize mass transfer of material to certain features once they are filled, while continuing to allow mass transfer of material to other features that have not yet filled, when depositing on workpiece surfaces that have an insulator such as a resist over certain top surfaces of the workpiece.

BRIEF DESCRIPTION OF THE DRAWINGS

FIGS. 1–2C are schematic illustrations of a prior art thru-mask contact deposition process;

DETAILED DESCRIPTION

In wiring fabrication process according to the present invention, a conducting layer, which typically includes a barrier layer and a seed layer, is formed on the semiconductor substrate. Patterning and etching processes on a resist formed thereover are then performed to form features or cavities in the resist layer. In the following step, plating of copper, or copper alloys, or silver alloys and their various combinations into the features is begun, using either a conventional plating process or a planar electrodeposition process such as electrochemical mechanical deposition (ECMD). At some subsequent stage of plating, which is typically when a certain of the features are almost full, a planar deposition process such as ECMD is initiated to improve mass transfer of the material to be deposited into the other features that are not yet full, with the certain features typically being the larger features and the other features typically being the smaller features.

In an ECMD process, the metal deposition is achieved by applying a cathodic (-) voltage or current to a wafer surface with respect to an anode electrode while a plating solution wets both the workpiece or wafer surface and the anode electrode. Then, a workpiece surface influencing device (WSID) such as a mask, pad or a sweeper is used during at least a portion of the process when the wafer and the WSID is in very close proximity or in physical contact and relative motion is established between the workpiece surface and the WSID. The use of WSID assists filling the features on the workpiece in a planar manner. Particular WSID's are described in U.S. application Ser. No. 09/960,236 entitled, Mask Plate Design, filed on Sep. 20, 2001, also assigned to the same assignee as the present invention and U.S. application Ser. No. 09/961,193 entitled, Plating Method And Apparatus For Controlling Deposition On Predetermined Portions Of A Workpiece, filed on Sep. 20, 2001. Descriptions of various planar deposition methods and apparatus can be found in the following patents and pending applications, all commonly owned by the assignee of the present invention. U.S. Pat. No. 6,176,992 entitled, Method and Apparatus for Electrochemical Mechanical Deposition; U.S. Pat. No. 6,534,116 entitled, Plating Method and Apparatus that Creates a Differential Between Additive Disposed on a Top Surface and a Cavity Surface of a Workpiece Using an External Influence, and U.S. patent application Ser. No. 09/919,788 entitled, Plating Method and Apparatus that creates a Differential Between Additive Disposed on a Top Surface and a Cavity Surface of a Workpiece Using an Indirect External Influence, filed on Jul. 31, 2001.

Figure 3:
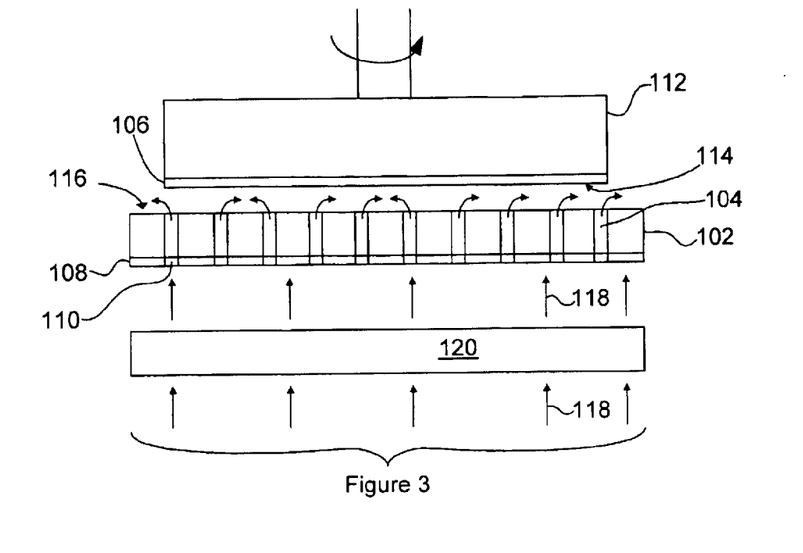
FIG. 3 is a schematic illustration of an ECMD system.

Reference will now be made to the drawings wherein like numerals refer to like parts throughout. FIG. 3, is a schematic illustration of a conventional ECMD system 100 which can be used with the preferred embodiment of the present invention.

In FIG. 3, a workpiece surface influencing device (WSID) 102 having openings 104 in it, is disposed in close proximity of a workpiece or wafer 106 to be processed. The WSID 102 is typically supported by a support plate 108 having perforations 110 or openings in it. The wafer 106 is a silicon wafer with surface features to be plated with a conductor metal, preferably copper or copper alloy, which surface features are obtained by using a pattern and etch of a resist as described above and shown in FIG. 4. The wafer 106 is retained by a wafer carrier 112 so as to position front surface 114 of the wafer against top surface 116 of the WSID 102. The openings 104 are designed to assure uniform deposition of copper from an electrolyte solution 118 onto the front surface 114, or uniform electroetching from the front surface 114. The top surface 116 of the WSID 102 facing the front surface 114 of the wafer is used as the sweeper and the WSID 102 itself establishes good electrolyte flow and electric field flow to the front surface 114 for globally uniform deposition. The ECMD system 100 also includes an electrode 120, which is immersed in the electrolyte solution 118. The electrolyte 118 establishes fluid communication between the electrode 120 and the front surface 114 of the wafer 106 through the openings 104 in the WSID 102. The electrode 120 is typically a Cu piece for Cu deposition. It may also be an inert electrode made of, for example, Pt coated Ti. An exemplary copper electrolyte solution may be copper sulfate solution, which may also contain additives such as accelerators, suppressors, leveler, chloride and such, which are commonly used in the industry. In addition to Cu, and its alloys other metallic films such as, Ag Pt, Ni, Cr, Au, Co, Pd and their respective alloys, lead-tin alloys, lead-free solder alloys maybe deposited by this method, as mentioned previously.

The exemplary system in FIG. 3 can perform depositions (such as ECMD) as well as electroetching. Therefore, it is referred to as an electrochemical mechanical processing (ECMPR) system, in general. The ECMPR system is capable of performing planar or non-planar plating as well as planar or non-planar electroetching. In this respect, if non-planar process approach is chosen, the front surface 114 of the wafer 120 is not brought into proximity of the top surface 116 of the WSID 102 so that non-planar metal deposition can be performed when the potential of the substrate or the wafer surface is made more cathodic than the electrode (for cathodic deposition). If the sign of the potential of the substrate with respect to the electrode is reversed, electroetching is achieved. If planar deposition approach is chosen, the front surface 114 of the wafer 120 is brought into close proximity, which is typically less than 0.75 mm and preferably in the range of 0.1 to 0.5 mm, or, preferably, contacts the WSID, as a relative motion is established between the WSID and the wafer surface. The top surface 116 of the WSID 102 sweeps the front surface 114 of the wafer while an electrical potential is established between the electrode and the front surface 114 of the wafer. In this respect, the front surface of the wafer contacts the surface 116 as a relative motion is established between the WSID and the front surface of the wafer during at least part of the deposition or electroetching time. As the process solution is delivered through the openings in the WSID, the wafer is rotated and laterally moved, while the front surface contacts the process surface. Under an applied potential between the wafer and the electrode, and in the presence of the process solution that raises through the WSID, copper is plated on the front surface of the wafer depending on the polarity of the voltage applied between the wafer surface and the electrode. When the polarity of the applied potential is reversed etching can be achieved.

Figure 4:
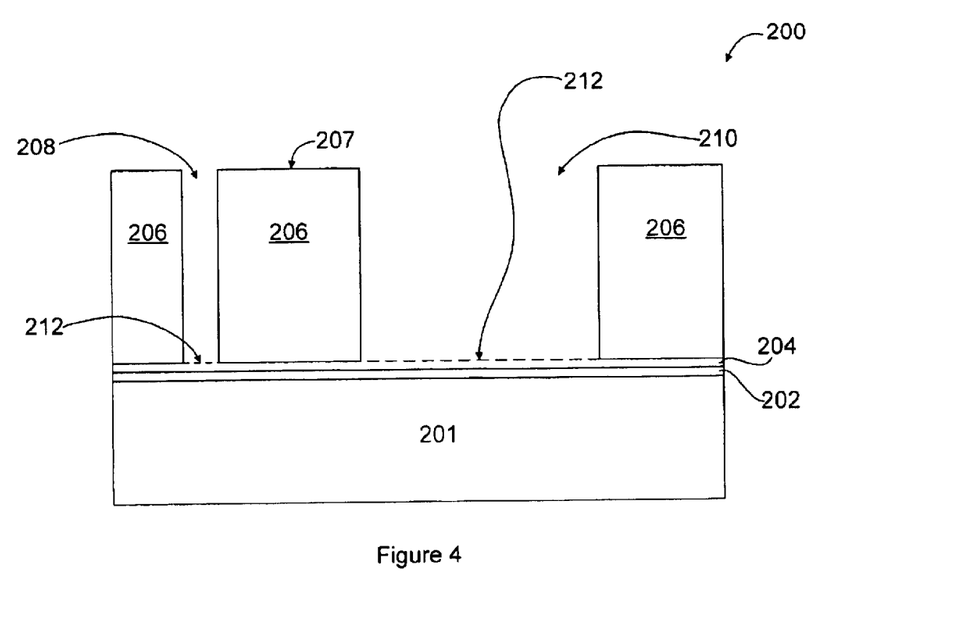
FIG. 4 is a schematic illustration of a substrate having a patterned masking layer.

FIG. 4 shows a portion 200 of the front surface 114 of the wafer 106 to be electroplated using the ECMPR system. The portion 200 is comprised of a substrate 201, preferably silicon and with layers therein, as described previously with respect to FIG. 1. A conducting layer, typically a barrier layer 202 and a seed layer 204, are coated on top of the substrate 201. For some material combinations, the barrier layer 202 may be omitted and the copper seed layer is coated onto the insulator. A mask or resist layer 206, having a top surface 207, is coated on top of the seed layer 204 and patterned and etched to form cavity features such as vias 208 and trenches 210. The mask layer maybe made of a dielectric material or a photoresist, preferably a hard photoresist material. The etching of the mask layer also partially exposes underlying seed layer and forms exposed seed layer regions 212. Exposed regions 212 form the bottom of the vias 208 and trenches 210. Subsequent metal growth, during the plating process, begins on the exposed regions and in a bottom-up fashion fills the features 208 and 210. It is noted that at least one of the top surface of the resist and the sidewalls of the features, or both, do not have a conductive layer disposed thereover.

Figure 5:
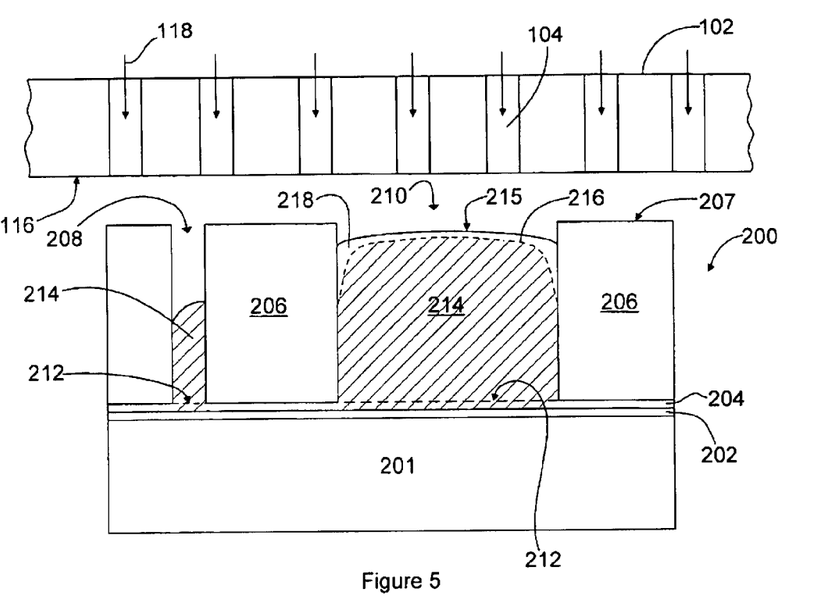
FIG. 5 is a schematic illustration of a substrate shown in FIG. 4, wherein the features are partially filled with copper using the process of the present invention.

FIG. 5 shows the substrate 200 at least some distance from the WSID 102 during conventional copper plating, if conventional plating is initially used. Preferably, the electroplating process is initiated without the WSID 102 contacting or being in close proximity to the top surface 207 of the mask layer 206, thus using a conventional electroplating process. At this stage, a copper layer 214 begins to grow on the exposed regions 212. As explained above in detail, although the copper layer 214 fills the larger features, i.e., trenches 210, and forms a top surface 215 having a somewhat convex shape, it partially fills the adjacent smaller features, i.e., vias 208. As shown in FIG. 5, the via 208 is not filled with copper up to the level of the top surface 207. In particular, as the copper fills the trenches and as it gets closer to the surface level of the mask, it may initially form a tapered top 216. As the plating continues a top layer 218 covers the tapered top 216. With no WSID contact to the top surface 207, depending on the sensitivity of the endpoint detection that is being used, the top surface 215 may be allowed to rise up to the level of the surface 207 or may be grown just below the level of the surface 207. At some point, however, a planar deposition process is initiated, although it could have been used from the beginning as well. In the example shown, the top surface is grown below the level of the surface 207, but it could be above. Thus, a planar deposition process can be initiated regardless of how far up or down the copper layer is in the features.

Figure 6:
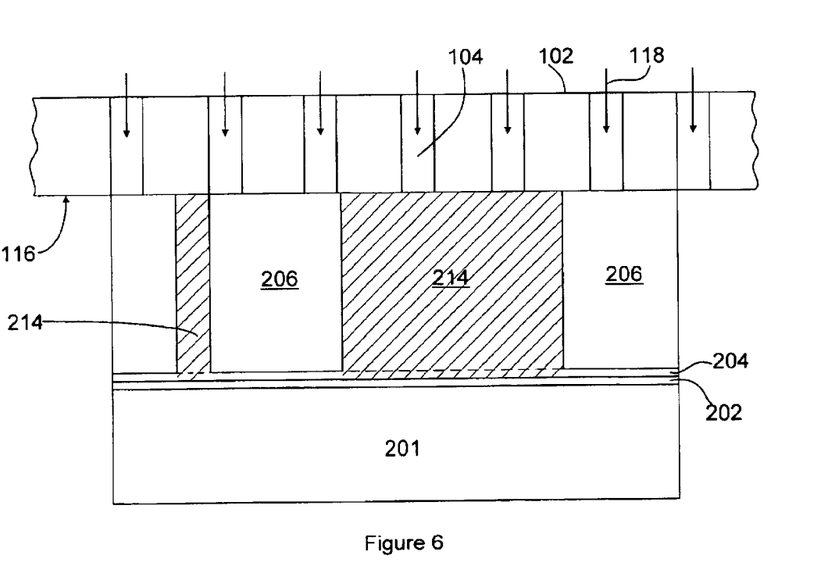
FIG. 6 is a schematic illustration of the substrate shown in FIG. 5, wherein the features are filled with planar copper deposits.
Figure 7:
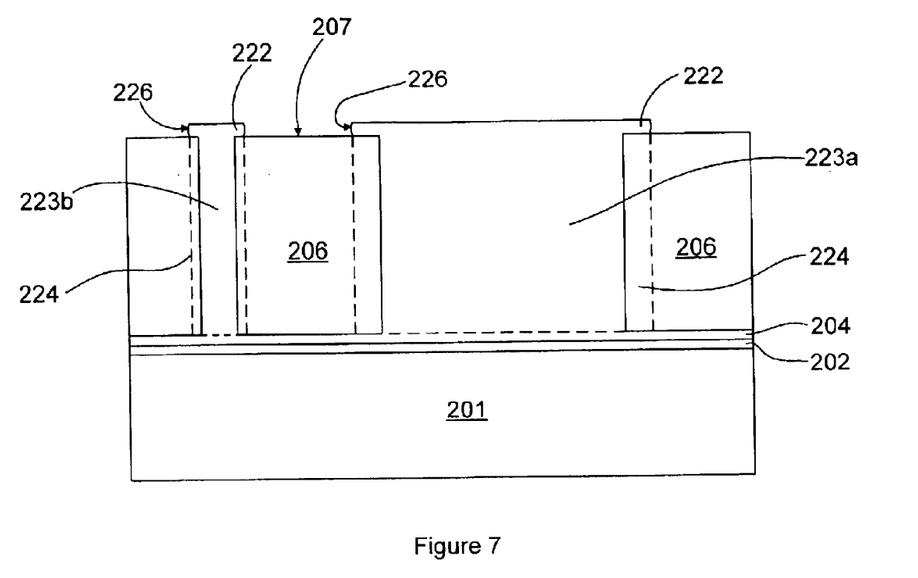
FIG. 7 is a schematic illustration of the substrate shown in FIG. 6, wherein flat nail head structures have been formed.

As shown in FIG. 6, once a planar deposition process such as ECMD is initiated, as the WSID 102 contacts or comes in close proximity to the surface 207 and as relative movement between the wafer and WSID 102 takes place, the sweeping action on the top surface 215 polishes and/or starves electrolyte from the top surface of the copper layer 214 in the trench 210 and/or influences additive concentrations on the top surface of the copper layer 214 and within the trench 210 and as a result delays its upward growth. Meanwhile, the copper plating in the via 208 continues and the plated copper quickly fills the via 208. Once the vias 208 are filled, the process can be stopped. As shown in FIG. 7, however, if the contact plating is continued the copper layer 214 in the via and trench 208, 210 continues its lateral and vertical growth in a planar fashion and forms planar caps (flat nail head structure) 222 on a first structure 223a and second structure 223b. Flat caps or flat nail head structures 222 may have many uses in the following process steps.

It should also be noted that at some time or times during the process, electroetching (also referred to as ECME for electrochemical mechanical etching) can be initiated, so as to remove conductive material that has been previously deposited. Alternating between ECMD and ECME can allow for greater control of the finally resulting product by controlling the process to a greater degree, rather than simply using deposition followed by a planar deposition process such as ECMD. Further, while the overall process as described above included conventional deposition followed by a planar deposition process such as ECMD, the conventional deposition and planar deposition processes can be intermittently used.

In one example, flat caps 222 may be used as sacrificial caps to avoid unwanted etching of the structures 223a and 223b in the vias and trenches, during the etching of the remains of the mask layer 206 and the underlying seed layer and barrier layer portions. Without the planar cap 222, tops of the structures 223a, 223b may be rounded and heights of the structures become reduced as discussed before in relation to FIG. 2B and FIG. 2C.

Figure 8:
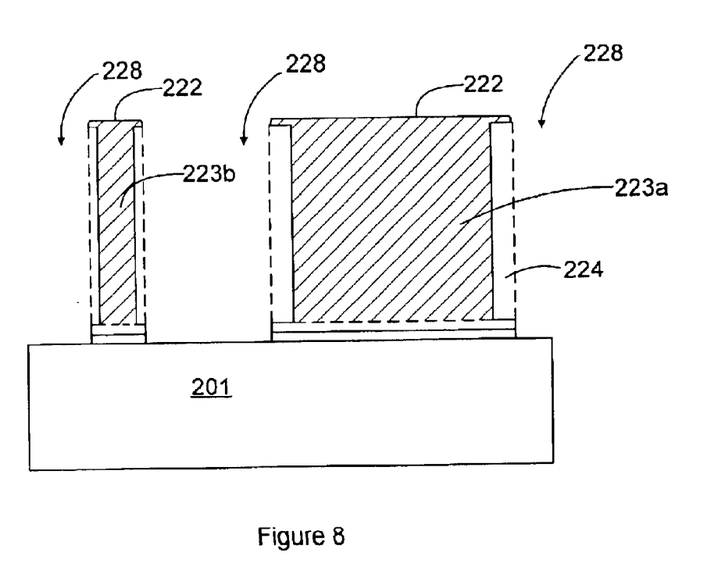
FIG. 8 is a schematic illustration of the substrate shown in FIG. 7, wherein the masking material surrounding the flat nail head structures have been partially removed.

Further referring to FIG. 7 and as illustrated in FIG. 8, if a vertically directional etching is applied to remove the mask layer 206, mask portions 224 adjacent the structures 223a, 223b are also prevented from being etched because of the edges 226 of the cap 222. An exemplary directional etching process may be RIE (reactive ion etching). Mask portions 224 or side wall spacers or insulators further protect the sides of the structures 223a, 223b from etching agents as a etch barrier during the removal of the remains of the seed layer and the barrier layer below the resist. As shown in FIG. 8, the side wall spacers 224 also serves to minimize any under cut at the bottom of small structures. The novel structure shown in FIG. 8 may be used in direct solderless or direct bond applications. For example, the planar cap 222 may be selectively passivated with very thin electroless coating or coatings. In other applications, other devices may be attached to the planar cap 222 at low temperatures in vacuum, using vacuum bonding processes. After a bonding step, the substrate is thermally treated to improve the bond strength or the cohesion. Further, gap 228 surrounding the structures 223a, 223b enhances device performance by enhancing the heat transfer from a device to the ambient in a more efficient manner. Side walls of the structures 223a, 223b and top surface of the substrate 201 define the gap 228.

Also, in other applications, the air gap 228 may be filled with a low dielectric constant material using PVD or spin coated. For example, benzocyclobutene (BCB) may be spin coated into the air gap to enhance overall device performance. In other applications, device integration and wiring density can be substantially increased by combining very fine and large features in the substrate, after the planar deposition shown in FIG. 7. Afterwards, the nail head 226 may be briefly removed using known methods such as, etching, electropolishing, CMP or copper RIE, to obtain a very planar surface with very high wiring density device.

Referring to FIG. 8, the caps 222 get thinner during the etching of the seed layer remains that are below the resist. In some applications, a further etching step removes the sidewall spacers 224 and the sacrificial caps 222 entirely, as shown in FIG. 9.

It is important that, at the end of the process, the height $H_3$ of the small structure 223b and the large structure 223a remains essentially the same. There is no penalty for admixture of small and large features in a device or for their proximity to each other. The process and the resulting structures described with help of FIGS. 8 and 9 are very desirable, especially when compared to the structures resulting from the traditional deposition processes shown in FIGS. 2B and 2C. A specific advantage thus obtained is that the overfill structures, such as the copper dome structure 26 illustrated in FIG. 2B, do not result. Thus, the subsequent removal step, typically a CMP process, that is used to remove such overfill structures, which is necessary using convention deposition is not necessary according to the present invention.

In another embodiment of the present invention, the resist material 206 and the conducting films 204 and 202 between the structures 223b and 223a may be removed by directionally selective methods such as laser ablative techniques, in certain locations to create a custom pattern or device. For example, the width of the gap 228 between the structures 223a, 223b may be varied to create, for example, a precision timing element or a fuse within a circuit. Such fuse incorporates a redundancy into the circuit or reroutes signals away from certain defective areas of the device. In yet another embodiment, for copper or copper alloy structures, the masking layer 206 may be made of a low-k material. Portions of the low-k resist layer 206 (between certain structures) along with the conductive layers 202, 204, may be removed using directionally selective material removal techniques such as laser ablation. The resulting gap between the structures may then be filled with a high dielectric constant material, to form a passive electrical element, for example, a capacitor or a vertical capacitor structure. The dielectric constant of the insulation or dielectric material may preferably be between 4 and 5,000, preferably greater than 7. Excess dielectric material is removed using a known process to planarize the structure. By combining the use of low-k and high-k insulators with the structure 223b, horizontal and vertical passive electrical elements or structures can be incorporated into the device.

Figure 9:
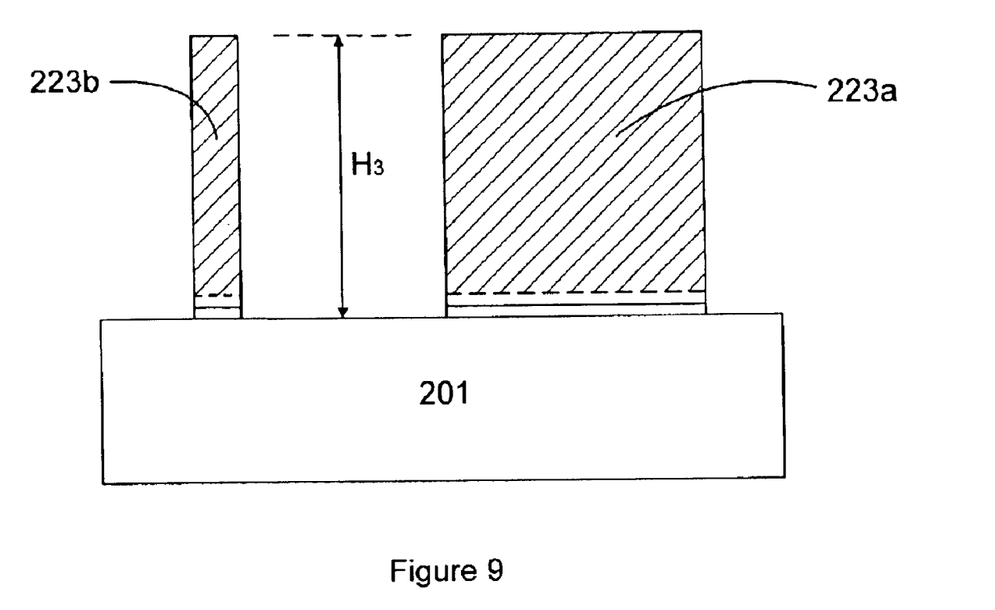
FIG. 9 is a schematic illustration of the substrate shown in FIG. 8, wherein the remaining masking material and the caps of the flat nail head structures have been removed.

In another embodiment, the resist material 206 and the conducting layers 204 and 202 are removed by known methods to expose the surfaces of the structures 223b, 223a as in FIG. 9. Then the exposed surfaces of the members 223a, 223b may be coated with a very thin layer of barrier/adhesion layer or protective layer, by electroless deposition methods. For example, a barrier layer of CoP between 2 to 500 nm may be coated over the copper or copper alloy structures. The electroless deposited CoP layer may be then coated with a nickel alloy such as NiP or NiB by again utilizing electroless deposition methods. The nickel alloy or nickel surface is then passivated with an electrolessly deposited gold layer for bonding applications. The new structure consists of planar thru-mask plated copper or copper alloys that are passivated on the horizontal and vertical surfaces with materials which are deposited using electroless deposition techniques. The structures are isolated by air gap. In some applications, once the barrier coating is over, the surfaces of the plated structures 223a, 223b and the gap between the plated structures is filled with a low-k material. The unwanted or excess low-k film is then removed using known planarization processes such as CMP, to expose the plated surface. Also, for some low-k materials, for example BCB, the bond between the plated copper structures and the low-k film may be sufficiently strong so that a barrier or adhesive layer may not be necessary.

In another embodiment of this invention, the plated structures 223b and 223a may be, for example, made of lead-tin solder, silver solder or lead free solder, and the masking or resist material may be a low-k material as described above. After the planar deposition process, the various electrical structures of interest are isolated by directional material removing processes, such as laser ablation, by ablading a small portion of the resist material 207, the seed layer 204 and barrier layer 202 between the plated structures 223a, 223b. The width of the ablaged gap is sufficient to prevent the electrical shorting of structures of interest, and yet provide enough sidewall spacer 224 to support the structures 223a, 223b during a thermal reflow step. After the directional removal of the resist material and the conducting materials beneath, the plated structure may be thermally treated to reflow the structure during the bonding step or prior to the bonding process. If more volume of solder material is needed for the bonding application, a portion of the resist material may be selectively removed from the top surface 207 prior to the reflow or bonding step.

The present invention offers wiring circuit designers a new freedom for device geometry layout and disposition, which has not been previously available. Wiring density can be substantially increased, and active and passive elements can be integrated in very close proximity, and also device input/output can be dramatically increased.

Although the present invention has been particularly described with reference to the preferred embodiments, it should be readily apparent to those of ordinary skill in the art that changes and modifications in the form and details may be made without departing from the spirit and scope of the invention.

What is claimed is:

1. A process for forming a conductive structure on a substrate having a conductive layer that is partially exposed through a plurality of openings in a masking layer that is formed on the conductive layer, the process comprising the steps of:

electroplating a conductive material through the openings and onto the conductive layer;

and continuing electroplating while mechanically sweeping top surface of the masking layer thereby forming planar conductive material deposits filling the plurality of holes wherein upper ends of the conductive deposits are substantially co-planar.

2. The process of claim 1, wherein the electroplating step fills some of the openings while partially filling the rest of the openings.

3. The process of claim 2, wherein the mechanical sweeping affects the deposition rate such that the rate of deposition is higher at the partially filled openings than at the filled openings.

4. The process of claim 1, wherein forming planar conductive material deposits negates a requirement for a chemical mechanical polishing process to remove excess conductive material.

5. The process of claim 1 further comprising stripping the remaining masking layer after forming the planar conductive material deposits.

6. The process of claim 5 further comprising etching the exposed conductive layer not covered by the electroplated conductive material using an etching solution.

7. The process of claim 1, wherein the step of the electroplating a conductive material within the openings and onto the conductive layer is performed while mechanically sweeping the masking layer.

8. The process of claim 1, wherein the upper ends of the planar conductive material deposits are substantially co-planar with the level of top surface of the masking layer.

9. The process of claim 1, wherein the upper ends of the planar conductive deposits are above the level of the top surface of the masking layer.

10. The process of claim 9, wherein the upper ends of the planar conductive deposits comprises side protrusions expanding outwardly over the surface of the masking layer, thereby forming a flat nail head structure.

11. The process of claim 10, wherein the step of etching etches the side protrusions while etching the exposed conductive layer not covered by the electroplated conductive material.

12. The process of claim 1, wherein the conductive material is copper.

13. The process of claim 1, wherein the electroplating process is electro chemical mechanical deposition.

14. The process of claim 1, wherein the conductive layer comprises a copper seed layer.

15. The process of claim 1, wherein the masking layer comprises a photoresist.

16. The process of claim 1, wherein the masking layer comprises an insulator.

17. An integrated circuit manufactured according to the process of claim 1.

18. A flat nail head structure manufactured according to the process of claim 1.

19. A process for forming a conductive structure on a substrate having a conductive layer that is partially exposed through a plurality of openings of a masking layer that is formed on the conductive layer, the process comprising:

electroplating a conductive material within the openings and onto the conductive layer while mechanically sweeping the masking layer thereby forming planar conductive material deposits filling the plurality of holes wherein upper ends of the conductive deposits are substantially co-planar.

* * * * *